United States Patent [19]

Weiler

[11] Patent Number: 5,559,056
[45] Date of Patent: Sep. 24, 1996

[54] METHOD AND APPARATUS FOR CAPPING METALLIZATION LAYER

[75] Inventor: Peter M. Weiler, Palo Alto, Calif.

[73] Assignee: National Semiconductor Corporation, Santa Clara, Calif.

[21] Appl. No.: 372,386

[22] Filed: Jan. 13, 1995

[51] Int. Cl.⁶ .................................................. H01L 21/44
[52] U.S. Cl. ........................ 437/195; 437/189; 437/190; 437/192
[58] Field of Search ............................... 437/189, 190, 437/191, 192, 193, 194, 195, 203

[56] References Cited

U.S. PATENT DOCUMENTS

| | | | |
|---|---|---|---|
| 4,853,347 | 8/1989 | Bukhman et al. | 437/192 |
| 4,927,505 | 5/1990 | Sharma et al. | 437/192 |
| 5,227,336 | 7/1993 | Hirano et al. | 437/192 |
| 5,231,054 | 7/1993 | Kosugi | 437/192 |
| 5,232,873 | 8/1993 | Geva et al. | 437/192 |
| 5,266,526 | 11/1993 | Aoyama et al. | 437/192 |
| 5,298,459 | 3/1994 | Arikawa et al. | 437/192 |
| 5,310,699 | 5/1994 | Chikawa et al. | 437/192 |
| 5,353,246 | 10/1994 | Tsang et al. | 437/192 |

Primary Examiner—Kevin M. Pilardat
Attorney, Agent, or Firm—Hickman Beyer & Weaver

[57] ABSTRACT

A method for fabricating bond pads on a semiconductor device that reduces intermetallic growth between a metallization layer and a bonding layer is discussed. Initially a metallization layer is deposited over a substrate. Following steps include depositing a barrier layer over the metallization layer, masking a portion of the barrier layer, and etching the barrier layer and the metallization layer. Etching of the barrier and masking layers is performed utilizing the barrier layer mask as a mask for both the barrier layer and the metallization layer. Further steps include depositing a non-conductive layer conformally overlying the barrier layer, masking a portion of the non-conductive layer, and etching the non-conductive layer. Etching the non-conductive layer forms an exposed region of the barrier layer. A later step of this method includes forming a bond layer over the exposed region of the barrier layer, with one possible formation method utilizing an electrolysis process. Thus a bond pad with a capped metallization layer is produced with only two mask and etch steps. This bond pad will withstand ambient temperatures up to approximately 200° C.

10 Claims, 3 Drawing Sheets

METHOD AND APPARATUS FOR CAPPING METALLIZATION LAYER

BACKGROUND OF THE INVENTION

The present invention relates generally to bond pads fabricated on a semiconductor die. More specifically, during formation of a bond pad, a barrier layer is deposited over the metallization layer, the barrier layer is masked, and subsequently both the barrier layer and the metallization layer are etched in one step. Thereafter a bonding layer is formed over the barrier layer, preferably using an electrolysis process.

In the field of semiconductor devices, producing simple, reliable, and inexpensive bond pads is a primary concern of manufacturing. Bond pads are wired to device elements located in the semiconductor die substrate and provide exposed contact regions of the die which are suitable for wiring to components external to the die. In one typical case, a bonding wire is attached to the bonding pad at one end and a portion of the lead frame at the other. Any improvement which simplifies the manufacturing process, enhances the reliability, or reduces the costs of bond pads can provide a competitive advantage to those involved in the commercial manufacture of semiconductor devices.

One common, simple, and inexpensive bond pad is just an exposed aluminum portion. A gold bonding wire is bonded to this aluminum pad. When ambient temperatures are less than approximately 150° C., the physical attachment and the electrical connection between the gold wire and the aluminum pad are sufficiently reliable. However, when temperatures rise above 150° C., the bond rapidly degenerates due to the growth of gold and aluminum intermetallics. That is, the two metals start to diffuse between each other and begin forming aluminum-gold chemical compositions. As a result, porosity, delamination, and voiding occur within the bond. Time lapse and increased temperature tend to worsen this relationship, and the bond will eventually fail. Consequently, potential reliability problems prevent using the aluminum bond pad under conditions where the ambient temperature is known to exceed 150° C. Furthermore, even when the ambient temperature is less than approximately 150° C., the aluminum bond pad is susceptible to corrosion simply because it is exposed.

One prior art solution to this problem is discussed with reference to FIG. 1. Initially, an aluminum metallization layer 12 is deposited over the entire wafer 10. This metallization layer 12 is then masked and etched, thereby providing regions of the metallization layer 12 which are electrically connected to device elements in the substrate 10. Next, a non-conductive layer 14 is deposited conformally over the entire wafer. The non-conductive layer 14 is also masked and etched, providing an exposed region of the metallization layer 12. Then, a barrier layer 16 is deposited over the entire wafer. Finally, a gold bond layer 18 is deposited by reactive sputtering over the entire wafer, and, gold bond layer 18 and barrier layer 16 are simultaneously masked and etched so that only the previously exposed regions of the metallization layer are covered. Thus the gold bonding wire can be connected directly to the gold bond layer 18 which is in electrical contact with the metallization layer 12. The barrier layer 16 is made of a material which prevents intermetallics from forming between the metallization layer 12 and the gold bond layer 18.

Although the aforementioned method prevents the intermetallic degradation of the bond pads and corrosion of the metallization layer, it has generally not been implemented in wide scale production. This is due to the numerous manufacturing steps required and the high cost of material. Note that there are three costly mask and etch steps required in this process. This is one more than typically necessary for the aluminum bond pad. Additionally, because of the gold etching step, much of the gold used in this process is neither used in the final product nor can it be reclaimed. What is required is a process which effectively caps the metallization layer in a more cost effective manner.

SUMMARY OF THE INVENTION

To achieve the foregoing and other objects and in accordance with the purpose of the present invention, a low cost capping method and arrangement is disclosed which prevents corrosion of the metallization layer and prohibits intermetallic growth between the bond pad and the bonding wire. A method in accordance with one embodiment of the present invention contemplates fabricating bond pads on a semiconductor device by depositing a metallization layer over the substrate and a barrier layer over the metallization layer without an intermediate masking and etching step. The barrier layer is then masked and the barrier layer and the metallization layer are etched together or sequentially to form bond pad regions. Thereafter, a non-conductive passivation layer is deposited conformally overlying the barrier layer. The passivation layer is then masked and etched to expose at least a portion of the barrier layer in the bond pad regions. A bond layer is then formed over the exposed region of the barrier layer. The bond layer is preferably formed using an electrolysis process.

In some embodiments, the bond layer is formed directly over the barrier layer. In other embodiments, a contact layer is formed between the capping and bonding layers to improve the adhesion of the bonding layer and the electrical contact therebetween. When used, the barrier layer may also be deposited using an electrolysis process.

In accordance with another aspect of the present invention, a semiconductor device having improved bond pads is disclosed. Each bond pad has a metallization layer, a barrier layer, a non-conductive layer, and a bond layer. The metallization layer is formed over and in electrical contact with a portion of the substrate. The barrier layer lies over the metallization layer. The non-conductive layer is formed over the substrate and partially covers the barrier layer. The bond layer partially covers and is in electrical contact with the barrier layer. The barrier layer serves to substantially prevent both corrosion of the metallization layer and intermetallic growth between the metallization layer and the bond layer. In another embodiment, a contact layer is interposed between the barrier layer and the bond layer.

In one preferred embodiment, the metallization layer is formed from one of aluminum or an aluminum alloy, the barrier layer includes one of nickel-vanadium or titanium tungsten and the bond layer is formed from gold. In another preferred embodiment which includes a contact layer, the contact layer is formed from a material including copper. In another preferred embodiment, both the metallization and barrier layers are deposited by reactive sputtering.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

As is well known to those skilled in the art, mass produced semiconductor devices are normally fabricated in bulk using wafers which include a number of devices. Thus, the invention will be described as it applies to wafer processing. During wafer processing, a number of well defined regions of the wafer will become individual devices, each device commonly being referred to as an integrated circuit or a die. Hence a plurality of dies can be simultaneously fabricated, as any process steps which operate on the wafer operate on all the dies which comprise the wafer. Example process steps which can be performed simultaneously over a plurality of dies include depositing a non-conductive layer, depositing a metallization layer, and mask and etch steps. After further processing, each of these dies is typically used as a "chip" in a semiconductor package.

Each individual die has, in turn, a number of device elements which require electrical interconnection or "wiring" between the various elements which make up the final semiconductor device. For example, in the case of MOS-based integrated circuits, typical device elements requiring interconnection include sources, gates, and drains. In general, the wiring is done either to provide interconnection between internal device elements and/or an externally exposed region arranged for making an external connection. The wiring which provides an externally exposed region in electrical contact with a device element (or elements) is called a bond pad. While the present invention is for use in mass production of die bond pads on wafers as well as production of a single die bond pad, certain features of the present invention are often best described with respect to a single bond pad. Thus, for the sake of illustration, the Figures show a single bond pad in accordance with one embodiment of the present invention. Furthermore, the following description interweaves discussion related to a single bond pad with discussion of a wafer. Nevertheless, it will be apparent to one skilled in the art of semiconductor design how the present invention relates to both instances.

Figure 1:
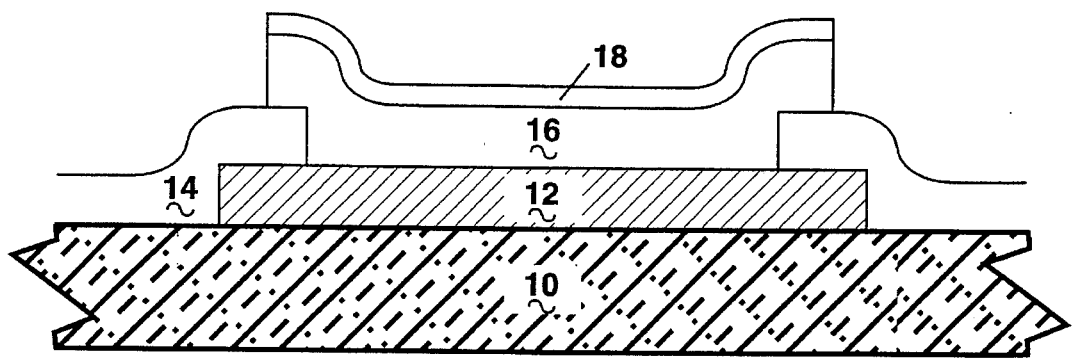
FIG. 1 is a diagrammatic cross-sectional view of a prior art capped semiconductor die bond pad.
Figure 2:
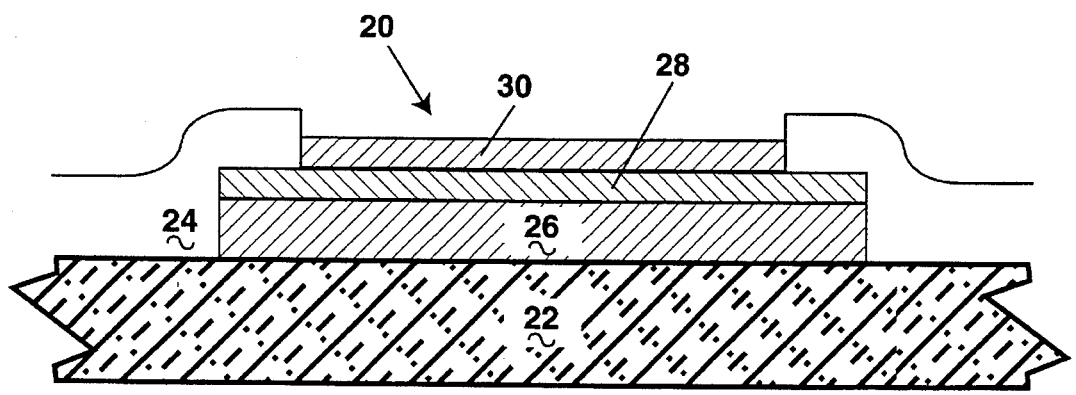
FIG. 2 is a diagrammatic cross-sectional view of the semiconductor die bond pad in accordance with a first embodiment of the present invention.

Referring initially to FIG. 2, a bond pad 20 in accordance with one embodiment of the present invention will be described. This bond pad 20 may be one of a plurality of bond pads located on a die, which in turn may be one die of a plurality located on a wafer. As shown in FIG. 2, a bond pad 20 is formed over a substrate 22 and is partially encapsulated by a non-conductive layer 24. The bond pad 20 includes a metallization layer 26, a barrier layer 28, and a bond layer 30. The bond pad 20 is in electrical contact with a semiconductor device element (not shown) present in the substrate 22. This device element may additionally be wired to other device elements via additional metallization layers not shown. Fabrication of other layers and wiring techniques are well known to those skilled in the art of semiconductor device design. As they are not directly relevant to the present invention, neither the device elements nor the other metallization layers are described herein nor shown in the Figures.

Figure 3A:
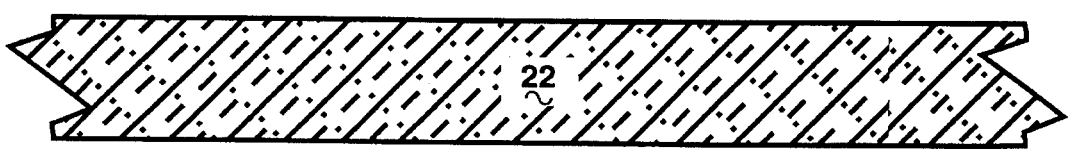
FIG. 3a is a diagrammatic cross-sectional view of the substrate of a partially fabricated semiconductor die in accordance with the first embodiment of the present invention.

A preferred embodiment of the present invention will be described with reference to FIGS. 2 and 3a–3d. The process begins with a partially fabricated semiconductor device as shown in FIG. 3a. The partially fabricated device includes a substrate 22 and other layers and components which are not shown. The device substrate 22 is normally a part of a wafer that includes a multiplicity of like devices, as discussed previously. Layers which may exist upon the substrate include metallization layers, non-conductive layers, field oxide layers, and barrier layers. Design and function of these layers, including their interconnection with bond pads, is well known to those skilled in the art of semiconductor device design.

Figure 3B:
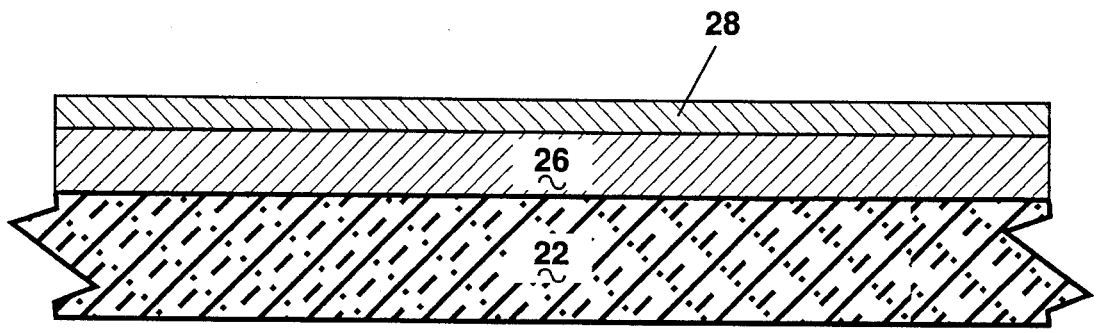
FIG. 3b is a diagrammatic cross-sectional view of the bond pad area of FIG. 3a after metallization and barrier layers have been deposited.

When it becomes time to form the bond pads, a metallization layer and a barrier layer are deposited over the entire surface of the wafer as illustrated in FIG. 3b. As seen therein a metallization layer 26 is first applied over the substrate and a barrier layer 28 is then applied over the metallization layer. The metallization layer 26 may be deposited using any suitable technique. By way of example, a reactive sputtering process has been found to work well. As will be appreciated by those skilled in the art, the material used to form the metallization layer 26 as well as the thickness of this layer may be widely varied in accordance with the needs of a particular application. By way of example, a suitable material for forming the metallization layer is aluminum. When sputtered aluminum is used as the metallization layer, thicknesses in the range of approximately 0.5–1 microns have been found to work well.

After the metallization layer has been deposited, a barrier layer 28 is deposited over the metallization layer 26. Like the metallization layer, the barrier layer may be deposited using any suitable technique such as a reactive sputtering process. The barrier layer serves to prevent both intermetallic growth between the metallization layer and the bond layer and corrosion of the metallization layer, while providing good electrical contact between these two layers. Thus, a variety of metals may be used as the barrier layer 28. By way of example, nickel-vanadium and titanium tungsten work well for capping an aluminum metallization layer. When such capping materials are sputtered, a capping thickness in the range of approximately 500–2000 Å works well, and more preferably in the range of approximately 1000–1500 Å. In a preferred embodiment, both the metallization layer 26 and the barrier layer 28 are deposited employing the same deposition system, although this is not a requirement.

Figure 3C:
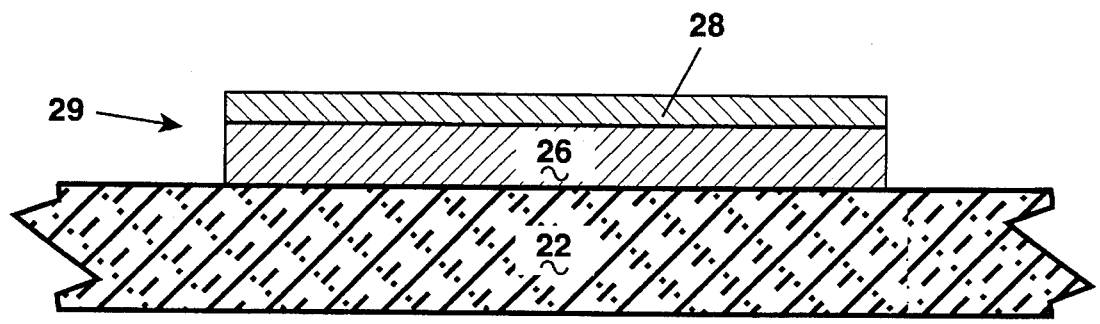
FIG. 3c is a diagrammatic cross-sectional view of the semiconductor die of FIG. 3b after the metallization and barrier layers have been masked and etched.

After the metallization and barrier layers have been applied, the wafer is masked and etched to form a multiplicity of bond pad regions 29 where the bond pads are to be located. The etching effectively removes the metallization and barrier layers in regions that are not intended to be bond pad areas. Of course, in most devices, the cleared regions (i.e. the areas outside of the bond pad regions) would be the majority of the device surface. The appearance of the bond pad region 29 after the masking and etching steps is illustrated in FIG. 3c. In the masking step, a mask is formed on the barrier layer 28 covering the portions of the metallization layer 26 and barrier layer 28 which are going to be used in the bond pad 20. Then, in the etch step, the undesired portions of the barrier layer 28 and the metallization layer 26 are etched away. This produces exposed portions of the aforementioned underlying layers along with the desired bond pad portions of the metallization layer 26 and the barrier layer 28. As is known in the art, there are numerous etching processes (e.g., a dry plasma etch or a wet etch with dilute HF), and the actual process employed is not particularly relevant to the present invention. In some embodiments, it may be desirable to use a single etchant to etch both the metallization and barrier layers while in other embodiments different etchants may be used to remove each layer. Regardless, it is important to note that depositing the barrier layer 28 immediately after depositing the metallization layer 26 enables both layers to be masked and etched using a single mask. This is in contrast to the two mask steps required in the prior art.

Once the bond pad regions 29 have been exposed, a non-conductive layer 24 is conformally applied over the entire wafer, which is in turn masked and etched to provide an exposed portion of the bond regions 29. The non-conductive layer 24 electrically insulates the exposed regions of the underlying layers but also covers the bond pad regions 29. The etching effectively removes portions of the non-conductive layer 24 thereby producing exposed portions 31 of the bond regions 29. Here, in contrast to the previous etch step, the majority of the device surface remains covered with the non-conductive layer 24.

Figure 3D:
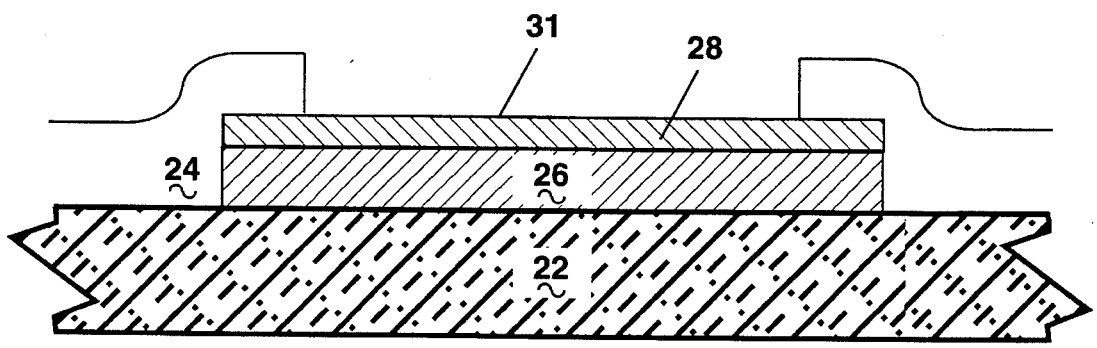
FIG. 3d is a diagrammatic cross-sectional view of the semiconductor die of FIG. 3c after a non-conductive layer has been conformally deposited over the substrate and the barrier layer and etched.

The appearance of the bond region 29 with an exposed region 31 after deposition of the non-conductive layer and the mask and etch steps is shown in FIG. 3d. First, a non-conductive layer 24 is conformally deposited over the wafer, completely insulating the exposed portions of the barrier layer 28, the metallization layer 26, and the aforementioned underlying layers. It should be appreciated that the non-conductive layer may be any number of conventional dielectric materials including oxides, nitrides and glasses such as a phosphorous silicate glass. In the masking step, a mask is formed over the wafer covering the portions of the non-conductive layer 24 which are going to be used for insulating the device surface. Then, in the etch step, the undesired portions of the non-conductive layer 24 are removed thereby producing the exposed regions 31. As is known in the art, there are numerous etching processes (e.g., a dry plasma etch or a wet etch with dilute HF), and the actual process employed is not particularly relevant to the present invention. Those of skill in the art will understand that depositing, masking, and etching the non-conductive layer 28 may be done by conventional processes.

After the regions 31 are exposed, a bond layer 30 is deposited overlying each exposed region 31. The bond layers provide exposed contact regions of the dies which are suitable for wiring to components external to the dies. Thus any material suitable for wiring to external components is appropriate for the bond layers. By way of example, gold has been found to work well. The bond layers 30 can be formed by a variety of processes. Deposition of a bond layer by reactive sputtering over the entire wafer, followed by mask and etch steps would be within the scope of the present invention. However, other methods which deposit isolated "islands" of bond layer material only overlying the exposed regions 31 may be more advantageous. In a preferred embodiment, bond layers 30 are deposited overlying only the exposed regions 31 by an electrolysis process. In one embodiment, the bond layer 30 includes gold and has a thickness in the range of approximately 1000–5000 Å, and more preferably 2000–3000 Å. By utilizing electrolysis, the bond layer 30 can be precisely disposed overlying only the exposed region 31 of the barrier layer 28. Thus, in one preferred embodiment of the present invention, there is no mask and etch step required in fabricating the bond layer 30. In contrast, the prior art teaches deposition of the bond layer over the entire wafer, thereby requiring subsequent mask and etch steps.

It should be appreciated that the barrier layer 28 establishes electrical contact between the bond layer 30 and the metallization layer 26, yet effectively prevents interaction between the two layers. Furthermore, the barrier layer 28, whether comprised of nickel vanadium, titanium tungsten, or an equivalent barrier material, has the ability to effectively prevent corrosion of the underlying metallization layer 26 and the ability to substantially inhibit interaction between the metallization layer 26 and the bond layer 30 up to temperatures of at least approximately 200° C. As will be appreciated by those of skill in the art, it may be necessary to submit the barrier layer 28 to an anneal process. If an anneal step is required, annealing temperatures in the range of approximately 400°–500° C. have been found to work well.

One embodiment of the present invention has the bonding layer 30 deposited directly on the barrier layer 28 as shown in FIG. 2. In an alternative embodiment shown in FIG. 4, a contact layer 32 is interposed between the barrier layer 28 and the bond layer 30. In some cases, depending on the materials chosen for the barrier layer 28 and the bond layer 30, and perhaps the method of formation, satisfactory electrical contact may not be established between these two layers. In other cases, the adhesion between the barrier layer 28 and the bond layer 30 may not be sufficient. The additional contact layer 32 will, in some cases, promote good electrical contact and/or ensure adhesion between the barrier layer 28 and the bond layer 30. Thus the material chosen for the contact layer 32 should be chosen with this in mind. As an example, if the barrier layer 28 is nickel vanadium and the bond layer 30 is gold, a copper contact layer 32 has been found to work well.

Similar to the bond layer 30, the contact layer 32 can be formed by a variety of processes, including reactive sputtering coupled with mask and etch steps. However, in one preferred embodiment, isolated islands of contact layer material are deposited only over the exposed regions 31. Once again, electrolysis is an appropriate method for producing these islands. In one embodiment, the contact layer 32 includes copper and has a thickness in the range of approximately 500–2000 Å, and more preferably 1000–1500 Å.

Figure 4:
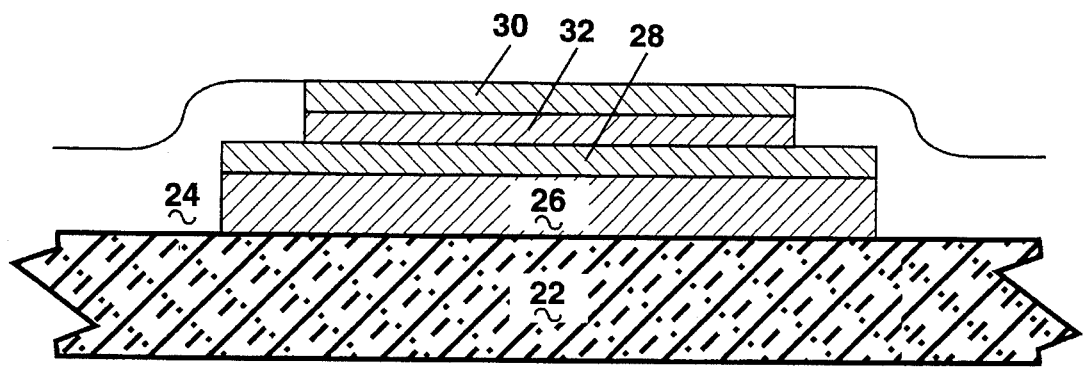
FIG. 4 is a cross-sectional view of a semiconductor die in accordance with a second embodiment of the present invention, wherein a contact layer and a bonding layer have been deposited over the barrier layer.

Typically the partially fabricated semiconductor dies shown in FIGS. 2 and 4 will undergo further processing steps and become a key component of a semiconductor package. In one likely processing step, gold bonding wires are used to electrically connect the bond pad 20 to another component internal to the semiconductor package. Additional processing and packaging steps are then performed to produce the final semiconductor package.

Although only a few embodiments of the present invention have been described, it should be understood that the present invention may be embodied in many other specific forms without departing from the spirit or scope of the invention. Particularly, it should be understood that the exact sizing, shaping, and placement of the various layers and components may be widely varied within the scope of the present invention. Furthermore, the material composition utilized in each of the layers can be varied and still provide good electrical contact and the required reliability. Still further, while the foregoing description often spoke in terms of a single bond pad, those skilled in the art will understand that this process can be used to form any number of bond pads, the number of which is not limited by this process. Therefore, the present examples are to be considered as illustrative and not restrictive, and the invention is not to be limited to the details given herein, but may be modified within the scope of the appended claims.

I claim:

1. A method for fabricating bond pads on a semiconductor device formed on a semiconductor wafer, said semiconductor device including a substrate, said method comprising the steps of:

depositing a metallization layer over the substrate;

depositing a barrier layer over the metallization layer;

masking a portion of the barrier layer in preparation for a first etching step;

etching the barrier layer and the metallization layer utilizing the barrier layer mask as a mask for both the barrier layer and the metallization layer;

depositing a non-conductive passivation layer conformally overlying the barrier layer and the substrate;

masking a portion of the non-conductive passivation layer in preparation for a second etching step;

etching the non-conductive passivation layer thereby forming an exposed region of the barrier layer; and forming a bond layer over the exposed region of the barrier layer.

2. A method as described in claim 1 wherein the step of forming a bond layer includes depositing a gold layer by an electrolysis process.

3. A method as described in claim 2 further comprising the step of forming a contact layer interposed between the exposed region of the barrier layer and the bond layer.

4. A method as described in claim 3 wherein the step of forming a contact layer includes depositing a copper layer by an electrolysis process.

5. A method as described in claim 1 wherein the step of depositing a metallization layer includes depositing aluminum by reactive sputtering.

6. A method as described in claim 1 wherein the step of depositing a barrier layer includes depositing nickel-vanadium by reactive sputtering.

7. A method as described in claim 1 wherein the step of depositing a barrier layer includes depositing titanium-tungsten by reactive sputtering.

8. A method as described in claim 1 wherein said etching steps are performed by a dry plasma etching method.

9. A method as described in claim 1 wherein said etching steps are performed with diluted HF.

10. A method for fabricating bond pads on a semiconductor device formed on a semiconductor wafer, said semiconductor device including a substrate, said method comprising the steps of:

depositing a metallization layer over the substrate;

depositing a barrier layer over the metallization layer;

masking a portion of the barrier layer in preparation for a first etching step;

etching the barrier layer and the metallization layer utilizing the barrier layer mask as a mask for both the barrier layer and the metallization layer, the etching performed by a single etch operation;

depositing a non-conductive passivation layer conformally overlying the barrier layer and the substrate;

masking a portion of the non-conductive passivation layer in preparation for a second etching step;

etching the non-conductive passivation layer thereby forming an exposed region of the barrier layer; and forming a bond layer over the exposed region of the barrier layer.

* * * * *